United States Patent [19]

Recker et al.

[11] Patent Number: 5,012,437
[45] Date of Patent: Apr. 30, 1991

[54] DIGITALLY CONTROLLED OSCILLATOR

[75] Inventors: Bradley J. Recker; Derrick I. Roe, both of Rockford; Christopher J. Rozman, Park Ridge, all of Ill.

[73] Assignee: Sundstrand Corporation, Rockford, Ill.

[21] Appl. No.: 442,899

[22] Filed: Nov. 29, 1989

[51] Int. Cl.$^5$ .............................................. G06F 15/20
[52] U.S. Cl. ..................................................... 364/701
[58] Field of Search ................................ 364/701, 718

[56] References Cited

U.S. PATENT DOCUMENTS

| | | | |
|---|---|---|---|
| 3,633,115 | 4/1970 | Epstein | 328/63 |
| 4,049,953 | 9/1977 | Evans, Jr. | 364/701 |
| 4,410,954 | 10/1983 | Wheatley, III | 364/701 |
| 4,656,649 | 12/1985 | Takahashi | 377/48 |

Primary Examiner—Dale M. Shaw
Assistant Examiner—Long T. Nguyen
Attorney, Agent, or Firm—Marshall, O'Toole, Gerstein, Murray & Bicknell

[57] ABSTRACT

A digitally controlled oscillator (DCO) includes a binary full adder having a first set of inputs coupled to input lines, a second set of inputs, a set of summation outputs and a carry output. A latch is provided having a set of latch inputs each coupled to one of the outputs of the binary full adder, a clock input and a set of latched outputs each coupled to one of the second set of inputs of the binary full adder wherein the binary full adder sums the bits of a latched period command signal which is provided on the input lines with bits appearing at the latched outputs and provides a summed value to the summation and carry outputs. A finite state machine is coupled to the carry output of the binary full adder and to the clock input of the latch wherein the machine produces the oscillator signal having a period determined by the period command signal.

11 Claims, 6 Drawing Sheets

DIGITALLY CONTROLLED OSCILLATOR

DESCRIPTION

1. Technical Field

The present invention relates generally to oscillator circuits, and more particularly to a digitally controlled oscillator (DCO) which produces an output signal with a desired period or frequency.

2. Background Art

Controllable oscillators have been used in applications to produce a signal having a controllable period or frequency. For example, in a variable speed, constant frequency (VSCF) power generating system typically used in aircraft or aerospace applications, the variable frequency output of a synchronous generator driven by a variable speed prime mover is rectified by a rectifier and then converted via a DC/AC inverter into constant frequency AC power to supply one or more loads. The inverter includes switches which are controlled by inverter control circuitry to produce the constant frequency AC output. In such an application, it may be necessary or desirable to temporarily or permanently connect the output of the VSCF system in parallel with another source of AC power. In such a case, it is necessary to adjust the phase and frequency of the inverter output to control the real and reactive power provided by the system. This phase and frequency control requires the use of a controllable oscillator which in turn determines the phase and frequency of the inverter phase outputs.

Epstein, U.S. Pat. No. 3,633,115 discloses a digital voltage controlled oscillator which provides an output clock signal at the same average frequency of an input clock signal, but without rapid phase variations present in the input clock signal. More particularly, a fixed frequency input clock source is coupled to one input of a digital phase comparator having a second input which receives the output of a binary counter. The binary counter in turn receives a fixed frequency clock signal from a pulse generator. The phase comparator develops a digital output which is coupled to a decision circuit. The decision circuit is further responsive to the output of the pulse generator and a timing source and causes the binary counter to add or subtract pulses as necessary such that the output of the counter follows the phase variation in the signal developed by the input clock.

Takahashi, U.S. Pat. No. 4,656,649 discloses a clock frequency divider circuit which produces signals of a desired frequency from input clock signals of first or second predetermined frequencies. The divider circuit includes first and second D flip-flops connected in master-slave configuration which together accomplish the frequency division.

SUMMARY OF THE INVENTION

In accordance with the present invention, a digital controlled oscillator (DCO) develops an oscillator output signal having an average period or frequency which is determined in accordance with an input command signal or word.

More particularly, the DCO develops an oscillator signal responsive to a digital period command signal consisting of a series of bits provided on input lines. The DCO includes a binary full adder having a first set of inputs coupled to the input lines, a second set of inputs, a set of summation outputs and a carry output. A latch is provided having a set of latch inputs each coupled to one of the outputs of the binary full adder, a clock input and a set of latched outputs each coupled to one of the second set of inputs of the binary full adder wherein the binary full adder sums the bits of the period command signal with bits appearing at the latched outputs and provides a summed value to the summation and carry outputs. A finite state machine is coupled to the carry output of the binary full adder and to the clock input of the latch. The gating circuit produces the oscillator output signal at a period determined by the period command signal.

In the preferred embodiment, the finite state machine has a sign input responsive to a sign signal representing the desired direction of deviation of the oscillator signal from a particular period.

In an alternative embodiment of the invention, the finite state machine comprises a further latch having latch and clock inputs and an output coupled to a first input of an AND gate and a clock generator that develops a clock signal which is provided to the clock inputs of the latches. The latch input of the further latch is coupled to the carry output of the binary full adder. The AND gate further includes a second input which receives a delayed version of the clock signal and an output at which the oscillator signal is developed.

The DCO of the present invention is simple in design, uses relatively few components, does not require a high frequency clock and is capable of producing an oscillator signal having a precisely controllable period or frequency over time and varying ambient conditions.

DESCRIPTION OF THE PREFERRED EMBODIMENT

Figure 1:
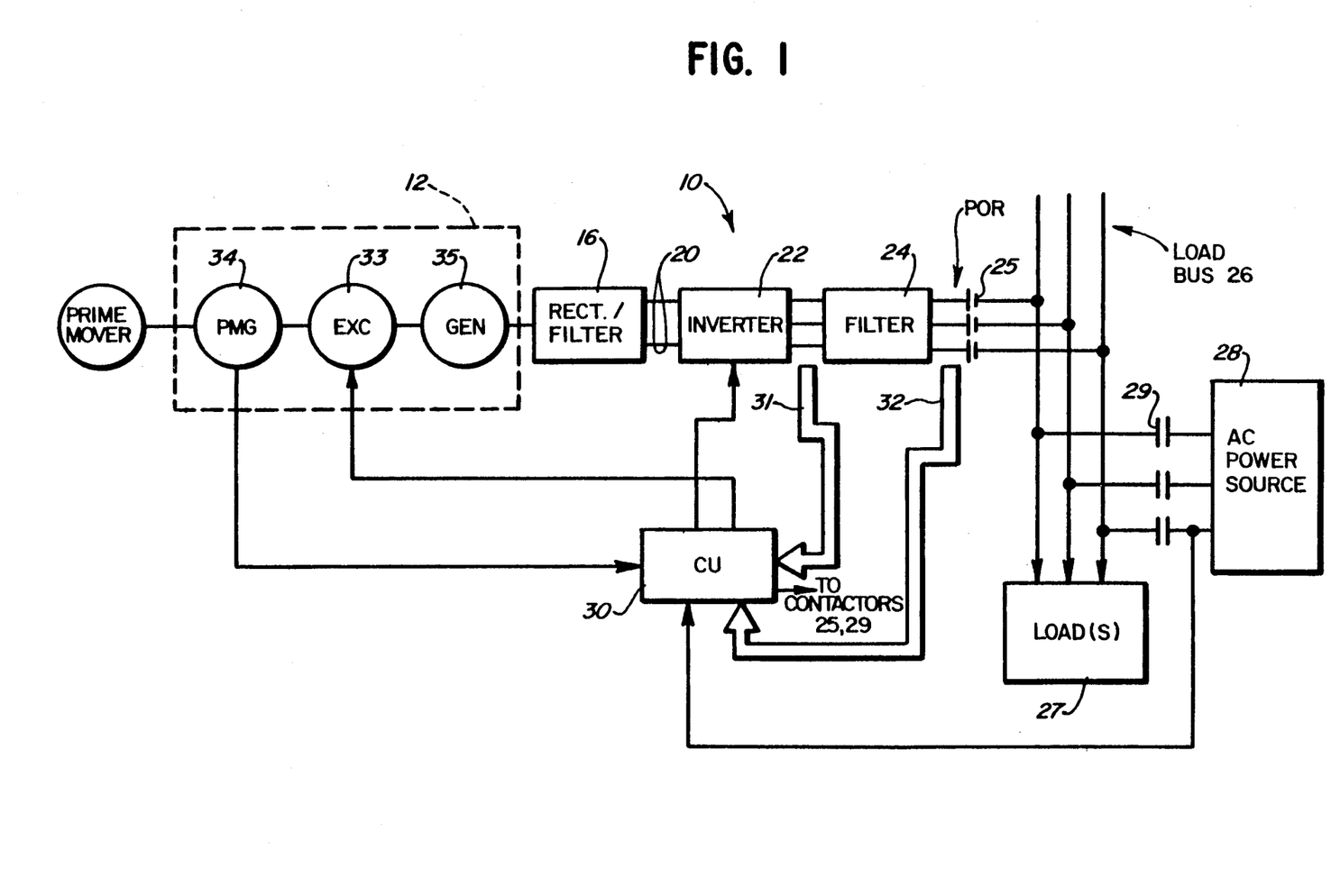
FIG. 1 comprises a block diagram of a variable speed, constant frequency (VSCF) system.

Referring now to FIG. 1, a variable speed, constant frequency (VSCF) system 10 is illustrated. The VSCF system 10 includes a brushless, synchronous generator 12 driven by a variable speed prime mover 14 which may be, for example, an aircraft jet engine. The generator develops a polyphase, variable-frequency AC output which is converted into DC power by a rectifier/filter 16. The resulting DC power is provided over a DC link 20 to a polyphase inverter 22 which converts the DC power into N phase constant-frequency AC power. This AC power may be filtered by an optional filter 24 and is provided via a set of controllable contactors 25 to a load bus 26. The load bus 26 is, in turn, coupled to one or more loads 27. The load bus may also receive power developed by another AC power source which is coupled through a further set of controllable contactors 29 to the load bus 26. The AC power source may comprise an external AC source, an on-board AC source such as a further VSCF system or the like. It should be noted that the arrangement of contactors shown in FIG. 1 is simplified for ease of understanding.

Figure 2:
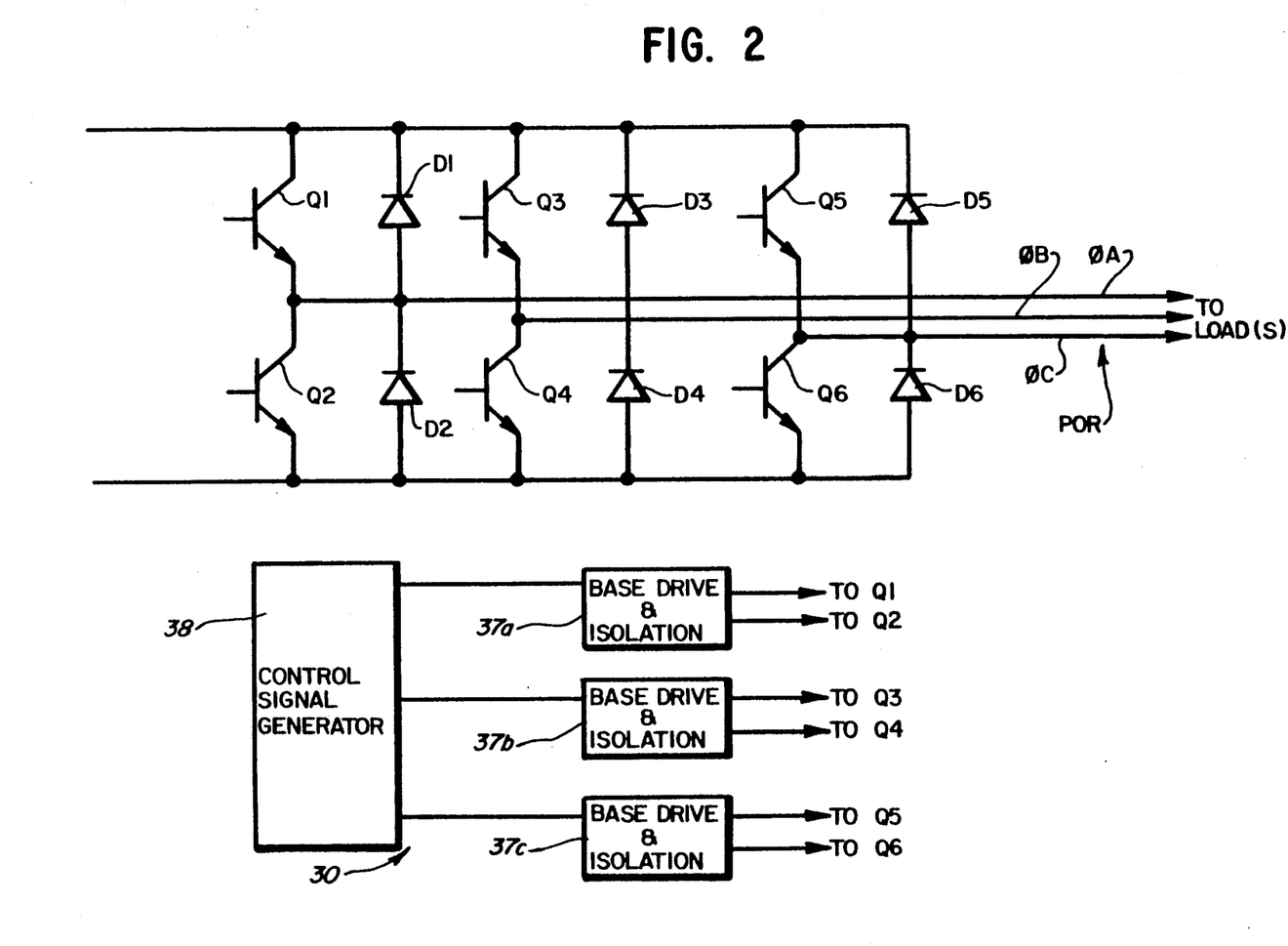
FIG. 2 is a simplified combined schematic and block diagram of the control unit and inverter illustrated in block diagram form in FIG. 1.

The inverter 22 includes six switches Q1-Q6, shown in FIG. 2, which are controlled by a control unit or CU 30. The CU 30 is responsive to output parameters of the inverter 22, as represented by the open arrow 31, as well as to output parameters at a point of regulation (POR), here shown as being at or near the contactors 25, as represented by the open arrow 32. The CU 30 further controls the current delivered to an exciter 33 of the generator 12. The generator 12 also includes a permanent magnet generator (PMG) 34 which supplies control power to the CU 30 and a main generator portion 35 having armature windings in which the generator power is developed.

The contactors 25 and 29 are controlled by the CU 30 to in turn couple either or both of the VSCF system 10 and the AC power source 28 to the load bus 26. The CU 30 may be responsive to the power developed on one of the phases of the load bus 26, for example phase C, and further develops a period or frequency command signal which controls the frequency of the system 10, as noted in greater detail hereinafter.

Referring specifically to FIG. 2, the switches Q1-Q6 of the inverter 22 are connected in a conventional three-phase bridge configuration together with associated flyback diodes D1-D6. The switches are controlled by base drive signals developed by base drive and isolation circuits 37a-37c. Each base drive and isolation circuit 37a-37c receives a control signal developed by a control signal generator 38, a portion of which is shown in greater detail in FIG. 3.

Figure 3:
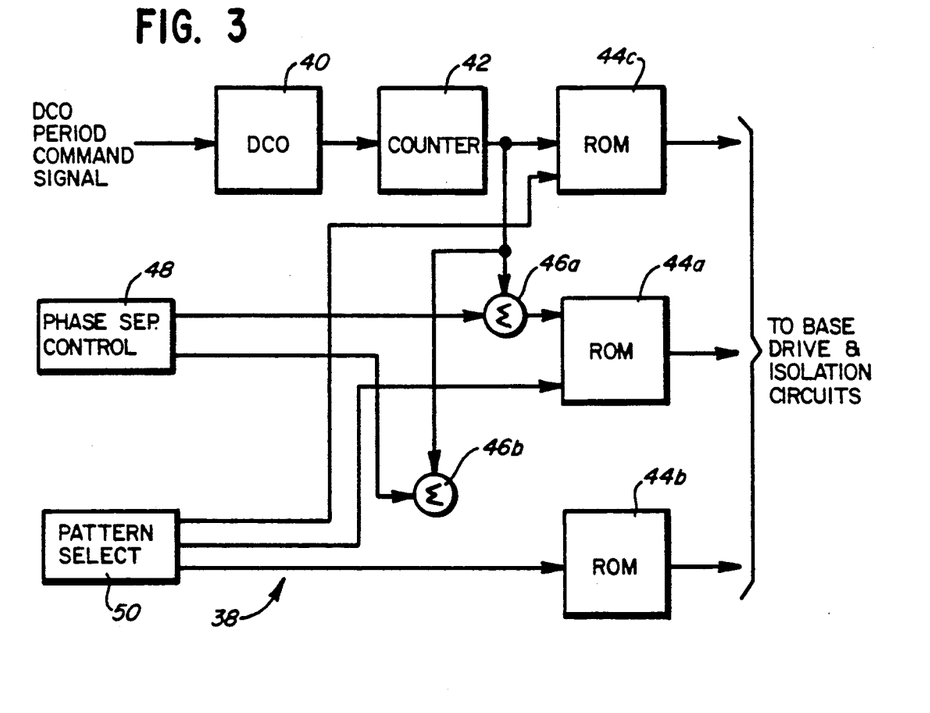
FIG. 3 is a simplified block diagram of the control signal generator illustrated in block diagram form in FIG. 2.

Referring now to FIG. 3, a DCO 40 according to the present invention receives a period command signal proportional to the desired period of the inverter phase outputs. Inasmuch as period is proportional to the inverse of frequency, the command signal also represents the desired output frequency of the inverter 22. Thus, for purposes of the present specification and claims, the term "period" should be considered synonymously with the term "frequency", and vice versa.

The DCO 40 produces an oscillator output signal which is provided to a counter 42 that in turn develops low order addresses for address inputs of a reference phase memory 44c. Other phase memories 44a, 44b receive low order addresses developed by summers 46a, 46b, each having inputs coupled to the output of the counter 42. Each of the memories 44a-44c is in the form of a read only memory (ROM) and stores a plurality of pulse width modulated (PWM) inverter control waveforms to control the switches associated with one of the inverter phases. It should be realized that all of the control waveforms could instead be stored in a single memory, if desired. Each PWM control waveform is stored as zeroes (representing notches) and ones (representing pulses) in successive storage locations of the memories 44a-44c. The frequency at which the successive memory locations are addressed is determined by the frequency of the oscillator signal developed by the DCO 40. This accessing frequency in turn determines the frequency of the signals produced by the memories 44a-44c, and thus the frequency and period of the inverter output.

Each of the summers 46a, 46b receives phase reference signals developed by a phase separation control which is described in greater detail in Rozman, et al., co-pending application Ser. No. 07/265,953, filed Nov. 2, 1988, and entitled "Phase Control for a VSCF System" (Sundstrand Docket No. B03003-AT1-USA), the disclosure of which is hereby incorporated by reference. The reference signals cause the PWM control waveforms developed by the memories 44a, 44b to be displaced 120° and 240° relative to the PWM control waveform developed at the output of the memory 44c.

In addition to the foregoing signals, the memories 44a-44c receive high order addresses from a pattern select circuit 50 which selects the appropriate control waveforms from the memories 44a-44c based upon output parameters of the power developed by the inverter 22 and/or the filter 24. The structure and function of the pattern select circuit 50 are unimportant to an understanding of the present invention, and hence will not be described in detail herein.

Figure 4:
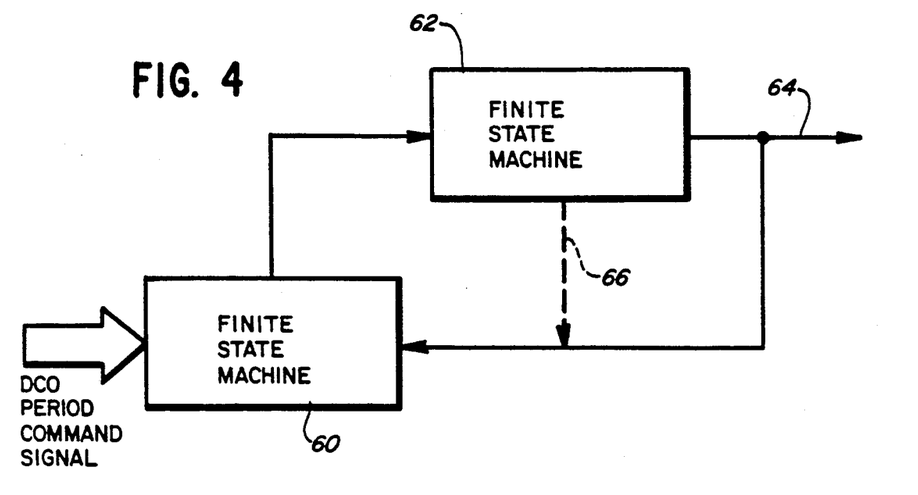
FIG. 4 comprises a simplified block diagram of the DCO according to the present invention.

Referring now to FIG. 4, the DCO 40 includes a first finite state machine 60 which receives the period command signal. Preferably, the period command signal comprises a series of digital words which are developed by a microprocessor (not shown). The finite state machine 60 in turn provides an output to a second finite state machine 62 which in turn develops the oscillator signal on a line 64. In addition, the first finite state machine 60 is clocked by the second machine 62. The finite state machine 60 may be clocked by the oscillator signal itself on the line 64 or by a different clock signal, represented as being provided on a dashed line 66.

Figure 5:
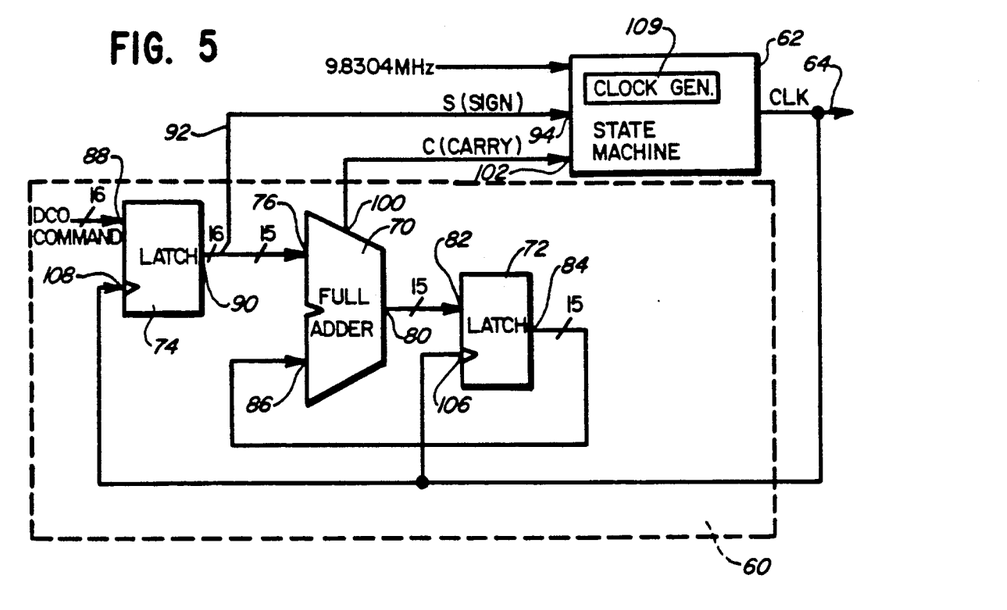
FIG. 5 comprises a more specific block diagram of a first embodiment of the DCO of the present invention.

Referring now to FIG. 5, there is illustrated a preferred embodiment of the DCO of the present invention. In the preferred embodiment, the finite state machine 60 includes a binary full adder 70 and first and second latches 72, 74 comprising D flip-flops. The full adder 70 includes a first set of 15 inputs 76 and a series of 15 summation outputs 80 which are in turn provided to a set of 15 latch inputs 82 of the latch 72. A set of 15 latched outputs 84 of the latch 72 are in turn coupled to a second set of 15 inputs 86 of the full adder 70.

The second latch 74 includes a set of 16 latch inputs 88 and 16 latched outputs 90. The most significant bit of each period command word provided on the set of 16 latch inputs 88 comprises a sign signal representing the direction of deviation of the desired oscillator period from a certain or reference period and is provided on a latched output over a line 92 to a sign input 94 of the second finite state machine 62. The remaining 15 bits of a latched DCO command word comprise magnitude bits representing the magnitude of the desired deviation of the oscillator output period from the certain or reference period. These 15 bits are provided to the first set of inputs 76 of the full adder 70.

The full adder 70 further includes a carry output 100 which is provided to a carry input 102 of the second finite state machine 62. The machine 62 develops the oscillator signal on the output line 64. The output line 64 is in turn coupled to clock inputs 106, 108 of the latches 72, 74, respectively.

Figure 6:
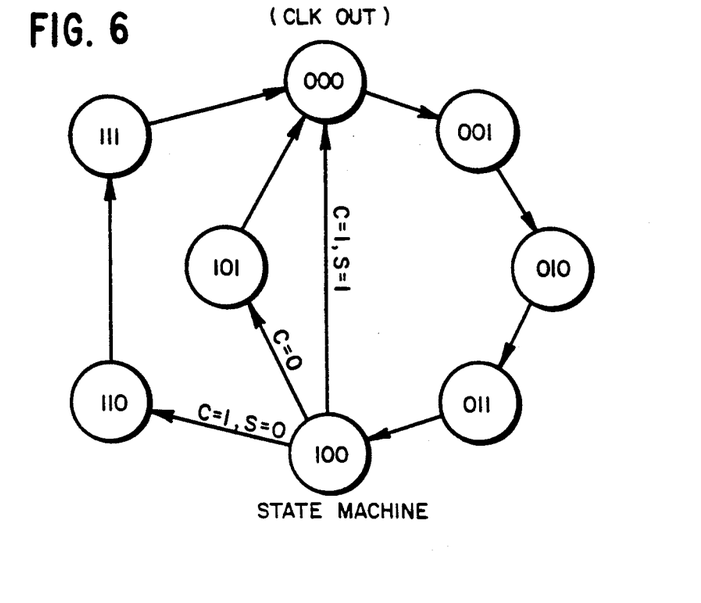
FIG. 6 comprises a state diagram illustrating the operation of the finite state machine 62 shown in FIG. 5.

The state diagram of FIG. 6 illustrates the operation of the second finite state machine 62. The internal states of the machine 62 are designated by binary numbers 000–111 representing states 0–7. The machine 62 follows a particular one of a plurality of state paths in dependence upon the signals provided to the sign and carry inputs 94,102. In the preferred embodiment, the number of state paths is equal to three wherein the first path comprises states 000, 001, 010, 011, 100, 101. The second path comprises the states 000, 001, 010, 011, and 100 while the third path comprises the states 000, 001, 010, 011, 100, 110 and 111. As should be evident from the foregoing, all of the state paths include the state 000 which, when assumed by the finite state machine 62 causes production of an output pulse in the oscillator signal. The finite state machine 62 changes states along one of the state paths each time a pulse is produced by an internal clock 109 operating at 9.8304 MHz. When an oscillator signal of 400 Hz. is to be produced, a DCO command word comprising zeros in all 16 bits is provided to the latch 74. With reference to the waveform diagram of FIG. 7, assume that at a time $t_0$ a pulse is produced in the oscillator output and is provided to the clock inputs of the latches 72 and 74. This output pulse, which is produced during the entire period of the clock signal developed by the internal clock 109 of the finite state machine 62, causes the latch 74 to transfer these 16 bits of the DCO command word to the 16 latched outputs 90. The zero in the most significant bit of the latched outputs 90 is provided to the sign input 94 of the finite state machine 62. In addition, assuming that no carry was produced by the full adder 100 prior to the time $t_0$, a zero or low state signal is provided to the carry input 102 of the finite state machine 62. Thereafter, upon the generation of each clock pulse by the internal clock 109, the finite state machine assumes the next state in the first state path comprising the states 000, 001, 010, 011, 100 and 101 and returns to the state 000 at time $t_1$. At this time, a pulse is produced in the oscillator output on the line 64, in turn causing the latches 72 and 74 to be clocked. Thus, the latch 72 provides a digital word developed at the summation outputs 80 of the full adder 70 to the second set of inputs 86 of the adder 70. In addition, the latch 74 latches the current command word supplied to the inputs 88 at the latched outputs 90. It should be noted that this command word may be the same as or different from the previous command word, such words being provided asynchronously to the latch 74.

Figure 7:
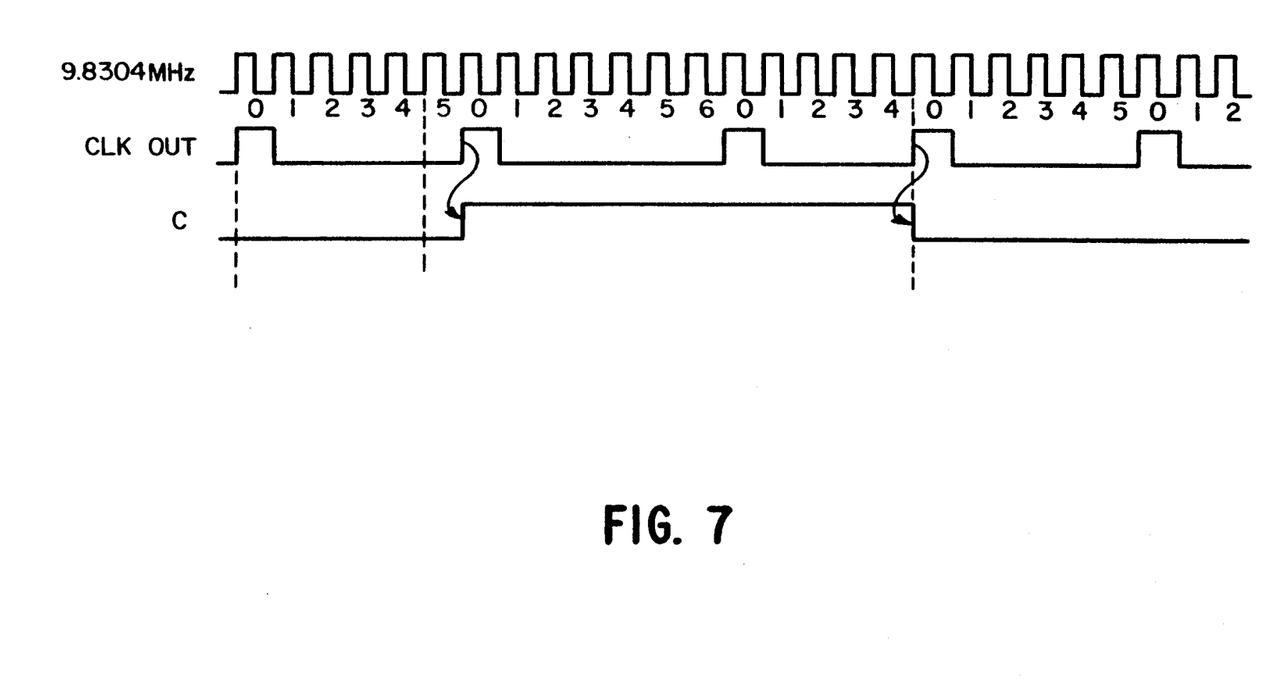
FIG. 7 comprises a series of waveform diagrams illustrating the operation of the DCO of FIG. 5.

Assume that at time $t_1$ the most significant bit of the latched outputs of the latch 74 is in a low state, signifying that the period of the oscillator signal 104 is to be increased by an amount represented by the 15 magnitude bits provided to the first set of inputs 76 of the full adder 70 and that the adder 70 develops a high-state carry signal which is provided to the carry input 102. Subsequent to the time $t_1$, the finite state machine 62 follows the state path comprising the states 000, 001, 010, 011, 100, 110 and 111 until the state 000 is again reached at a time $t_2$, whereupon another pulse is produced in the oscillator output signal. By following this seven-state path, the period of the oscillator output signal has been increased by a time equal to the duration of one clock pulse produced by the internal clock 109 of the finite state machine 62.

At the time $t_2$, the latches 72, 74 are again clocked, thereby causing new digital words to be provided to the inputs of the full adder 70 and the sign and carry inputs of the finite state machine 62. Assume that the sign input 62 receives a high state signal indicating that the period of the oscillator signal is to be decreased and that the digital words coupled to the inputs of the full adder 70 are such that a high state carry signal is provided to the carry input 102. The finite state machine 62 thereafter follows the state path 000, 001, 010, 011, 100 and returns to 000 at a time $t_3$. By following this five-state path, the period of the oscillator signal is equal to five clock periods, rather than six clock periods when no carry is produced by the adder 70 or seven periods when a carry is produced and the sign signal is in a low state.

As should be evident from the foregoing description, the greater the magnitude of the digital word provided as the 15 magnitude bits to the latch 74, the more frequently a high-state carry output is provided to the finite state machine 62, in turn causing the period of the oscillator signal to be increased or decreased from the certain period.

It should be noted that the propagation delay of the latch 72 and adder 70 together cannot exceed the period of the oscillator output signal on the line 64.

The finite state machine 62 may be implemented in software or hardware, as desired. If the latter, the machine may comprise discrete logic elements, or may be implemented as a VLSI chip. As should be evident to one of ordinary skill in the art, the design of the finite state machine 62 is straightforward given the state diagram of FIG. 6.

The 15-bit nature of the full adder 70 results in the generation of a stream of states in a sequence of 32768 bits in length at the carry output. The number of high states in the sequence is equal to the number represented by the 15 magnitude bits of the command word. These high-state pulses are distributed as evenly as possible in the oscillator output signal so that the average period taken over the 32768 bits is equal to the period represented by the DCO command word. Understanding of the circuit of FIG. 5 is facilitated by considering a simplified circuit wherein the full adder sums three-bit words provided by the latches 72 and 74, rather than 15-bit words. Thus, the full adder develops a repeating sequence of 8 bits, assuming the DCO command word is held at a constant value. As an example, assume that the DCO command word is equal to 011 (or the decimal number 3), which is a command to develop three high-state carry bits during each sequence of 8 bits produced at carry output of the full adder 70. Also assume that the output of the latch 72 is 000 immediately before a first pulse is produced in the oscillator signal provided on the line 64. Under these assumptions, the circuit will operate in the manner specified in the following table:

| CLOCK PULSE NUMBER | INPUT 76 OF ADDER 70 | OUTPUT OF LATCH 72 | CARRY |
| --- | --- | --- | --- |
| Initial Condition | 011 | 000 | ? |
| 1 | 011 | 011 | 0 |
| 2 | 011 | 110 | 0 |
| 3 | 011 | 001 | 1 |
| 4 | 011 | 100 | 0 |
| 5 | 011 | 111 | 0 |
| 6 | 011 | 010 | 1 |
| 7 | 011 | 101 | 0 |
| 8 | 011 | 000 | 1 |

Specifically, upon generation of the first clock pulse on the line 64, the latch 74 provides the digital word 011 at its latched outputs as does the latch 72. The full adder 70 thus develops the digital word 110 and a low-state carry signal is provided to the carry input 102 so that the machine 62 thereafter follows the first state path.

Upon generation of the next high state output of the oscillator signal developed on the line 64 following the generation of six internal clock pulses since the oscillator output changed from the low to the high state, the latch 72 latches the digital word 110 at its outputs. The full adder 70 thus develops the digital word 001 at its summation outputs 80 and provides a high state carry signal at its output 100. The rising edge of the next pulse in the oscillator output on the line 64 is produced after five internal clock pulses (if the sign bit is high) or seven clock pulses (if the sign bit is low) have been produced since the last rising edge in the oscillator output. The cycle continues in the manner shown in the table to produce three pulses which are as evenly spaced as possible in the 8-bit sequence.

As compared with the three-bit summer described above, the fifteen-bit adder 70 shown in FIG. 5 develops sequences of $2^{15}$ or 32768 bits in serial fashion. There are 4096 bits for each cycle of each inverter phase output and hence there are 32768/4096 or 8 cycles of each inverter phase output for each 32768-bit sequence produced by the adder 70.

For the case of the 15-bit circuitry shown in FIG. 5, the average period of the oscillator signal taken over the sequence of 32768 bits can be increased or decreased from a nominal value of 2.5 milliseconds up to ±416.7 microsecond. This corresponds to the ability to vary the output frequency of the DCO between 342.87 to 480 Hz.

Figure 8:
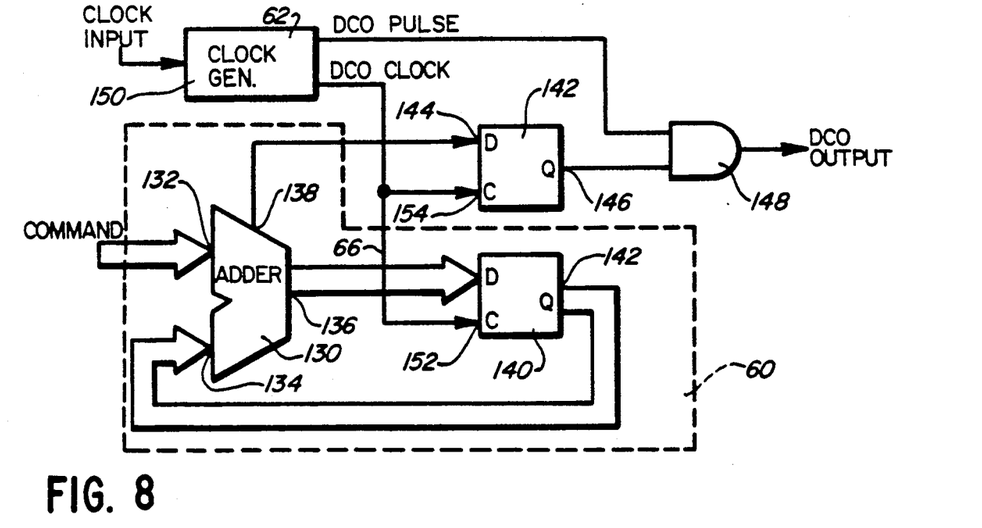
FIG. 8 is a block diagram of a further embodiment of the DCO of the present invention.

Referring now to FIG. 8, there is illustrated a further embodiment of the invention wherein the finite state machine 60 includes a 16-bit full adder 130 having first and second sets of 16-bit summation inputs 132,134 and a set of 16 summation outputs 136. The adder 130 further develops a signal at a carry output 138.

The 16 summation outputs 136 are coupled to latch inputs of a latch 140 comprising a D flip-flop. A set of 16 latched outputs 142 are coupled to the second set of inputs 134 of the adder 130.

The carry output 138 is coupled to a latch input of a further latch 142 which also comprises a D flip-flop. A single latched output 146 of the latch 142 is coupled to a first input of an AND gate 148. A second input of the AND gate 148 receives a clock signal, designated DCO PULSE, from a clock generator 150. The clock generator 150 in turn receives a clock signal developed by an external clock at a frequency of, for example, 9.8304 MHz. The clock generator 150 further develops a signal, designated DCO CLOCK, which is provided to clock inputs 152,154 of the latches 140,142, respectively.

In the embodiment of FIG. 8, the oscillator signal is produced by the AND gate 148. As opposed to the previous embodiment, the latch 140 is not clocked by the oscillator signal, but by the DCO CLOCK signal produced by the clock generator 150.

Figure 9:
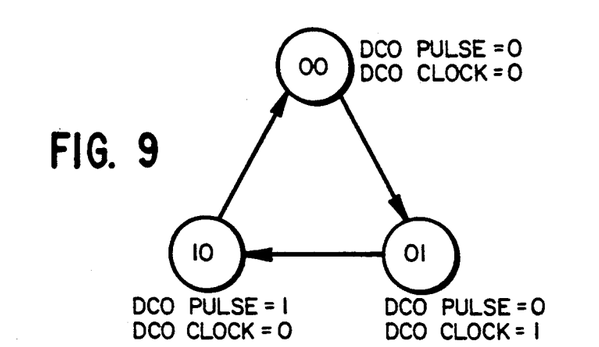
FIG. 9 comprises a state diagram illustrating the operation of the finite state machine 62 shown in FIG. 8.
Figure 10:
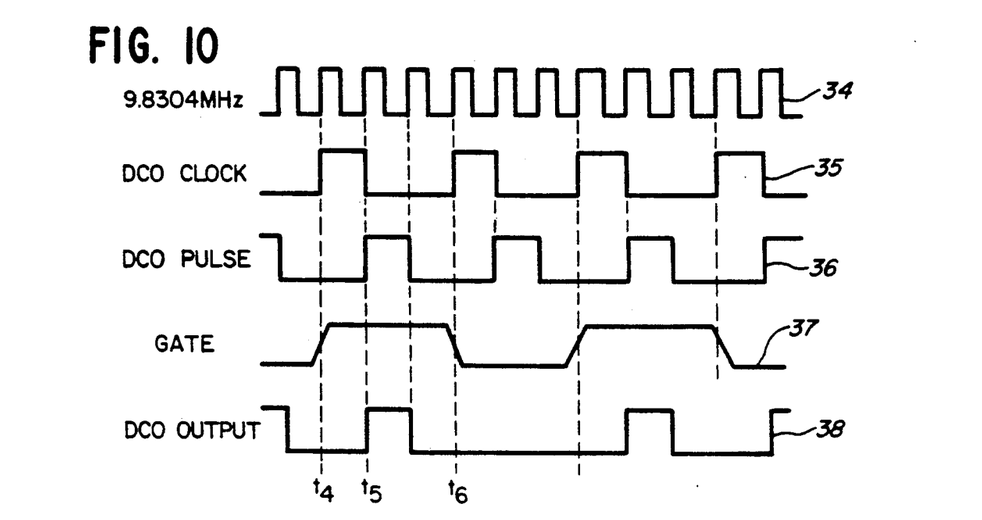
FIG. 10 comprises a series of waveform diagrams illustrating the operation of the DCO of FIG. 8.

As illustrated in FIGS. 9 and 10, the clock generator 150 comprises the finite state machine 62 which assumes a different one of three states upon generation of each pulse by the external clock. More specifically, these states are DCO CLOCK and DCO PULSE in a low state (state 00), DCO CLOCK in a high state and DCO PULSE in a low state (state 01) and DCO CLOCK in a low state and DCO PULSE in a high state (state 10). Thus, the DCO PULSE signal is identical to the DCO CLOCK signal, except that the former is delayed by the width of one pulse relative to the latter, and hence, Thus, the DCO PULSE signal comprises a delayed version of the DCO CLOCK signal. Further, the duration of each pulse in these signals is equal to the period of the clock signal provided to the clock input of the clock generator 150.

Assume that at time $t_4$, a rising edge in the DCO CLOCK signal is produced. At this time, the current states of the summation and carry outputs of the binary full adder 130 are latched to the second inputs 134 of the adder 130 and the latch input 144 of the latch 142. In addition, the signal appearing at the latch input 144 is transferred to the latched output 146 and hence is provided to the first input of the AND gate 148. Assume that at this time a high-state carry output is produced at the output 138 which is in turn provided by the latch 142 to the AND gate 148. Thereafter, at time $t_5$ the DCO PULSE signal switches to a high state, in turn causing the AND gate 148 to develop a high-state output for the duration of the high state of the DCO pulse signal.

Subsequently, assume that at time $t_6$ different values are latched by the latches 140,142 such that a low-state signal is provided to the first input of the AND gate 148. Subsequently produced pulses in the DCO PULSE signal are blocked by the AND gate 148 and such output remains in a low state until a high-state signal is again produced at the latched output 146 of the latch 142.

Inasmuch as the adder 130 and latch 140 are 16-bit machines, the carry output 138 of the adder 130 produces a stream of states in a sequence of 65536 bits in length. Again, the number of high states produced in the sequence is equal to the number represented by the binary command word provided to the first set of inputs 132 of the adder 130.

As opposed to the previous embodiment, the frequency of the oscillator signal produced by the AND gate 148 is proportional to the number represented by the command word provided to the first set of inputs 132 of the adder 130. Thus, the command word provided to the first set of inputs 132 does not include sign and magnitude bits; rather, the word represents the desired DCO frequency.

In summary, the embodiment of FIG. 8 produces a gating signal at the latched output 146 of the latch 142 which is used to gate the pulses in the DCO PULSE signal, allowing some or all to pass through to the output of the AND gate 148.

As should be evident from the foregoing, the design of each embodiment is extremely simple, thus leading to increased reliability. Also, neither embodiment requires the use of a high-frequency controllable clock to produce the oscillator output. It should be noted, however, that this advantage is obtained by controlling the average period of the oscillator signal rather than providing uniformly spaced pulses in such signal. Also, inasmuch as the oscillators are completely digital, no analog circuitry such as phase-locked loops are used, and hence the linearity and accuracy of the oscillators are unaffected by temperature changes, other ambient conditions and aging.

We claim:

1. A digitally controlled oscillator (DCO) which develops an oscillator signal responsive to a digital period command signal consisting of a series of bits provided on input lines, comprising:

a binary full adder having a first set of inputs coupled to the input lines, a second set of inputs, a set of summation outputs and a carry output;

a latch having a set of latch inputs each coupled to one of the summation outputs of the binary full adder, a clock input and a set of latched outputs each coupled to one of the second set of inputs of the binary full adder wherein the binary full adder sums the bits of the period command signal with bits appearing at the latched outputs and provides a summed value to the summation and carry outputs; and a finite state machine coupled to the carry output of the binary full adder and to the clock input of the latch wherein the finite state machine produces the oscillator signal whereby such signal has a period determined by the period command signal.

2. The DCO of claim 1, wherein the finite state machine includes a sign input responsive to a sign signal representing a desired direction of deviation of the oscillator signal period from a particular period.

3. The DCO of claim 2, further including an additional latch having a set of latch inputs and a set of latched outputs wherein a DCO command signal is provided to the latch inputs over a series of lines, the sign signal is provided to the finite state machine from one of the latched outputs of the additional latch and the period command signal is provided to the first set of inputs of the binary full adder from the remaining latched outputs of the additional latch.

4. The DCO of claim 3, wherein the additional latch includes a clock input and wherein the clock inputs of the latches receive the oscillator signal from the finite state machine.

5. The DCO of claim 4, wherein the latches comprise D flip-flops.

6. The DCO of claim 1, wherein the finite state machine includes a clock generator that develops a clock signal which is provided to the clock input of the latch, an AND gate and a further latch having a latch input coupled to the carry output of the binary full adder, a clock input which receives the clock signal and an output coupled to a first input of the AND gate, the AND gate further having a second input which receives a delayed version of the clock signal and an output at which the oscillator signal is developed.

7. The DCO of claim 6, wherein the latches comprise D flip-flops.

8. A method of producing an oscillator signal having a desired period, comprising the steps of:
   (a) providing a first latch having latch inputs and latched outputs;
   (b) providing a finite state machine having a sign input coupled to one of the latched outputs of the first latch, a carry input and an oscillator output at which the oscillator signal is produced whereby the machine follows a particular one of a plurality of state paths in dependence upon signals provided to the sign and carry inputs, each state path comprising a number of internal machine states which are sequentially assumed by the machine upon the generation of clock pulses by a clock and all of the state paths including a particular internal machine state whereby the machine develops an oscillator pulse each time the particular state is assumed;
   (c) providing a binary full adder having a first set of summation inputs coupled to the latched outputs of the first latch except the one latched output, a second set of summation inputs, a carry output coupled to the carry input of the finite state machine and a series of summation outputs;
   (d) providing a second latch having latch inputs coupled to the summation outputs of the adder and latched outputs coupled to the second set of summation inputs of the adder;
   (e) providing a series of digital oscillator command words to the latch inputs of the first latch wherein each command word includes a sign bit representing a direction of desired deviation of the oscillator period from a certain period and a plurality of magnitude bits representing the magnitude of such desired deviation;
   (f) clocking the first and second latches each time an oscillator pulse is produced whereby the sign bit of the command word appearing at the latch inputs of the first latch when such latch is clocked is provided to the sign input of the finite state machine, the magnitude bits of such command word are provided to the first set of summation inputs and a digital summation word appearing at the summation outputs of the adder when the second latch is clocked is provided to the second set of summation inputs of the adder.

9. A digitally controlled oscillator (DCO) which develops an oscillator signal responsive to a digital period command signal consisting of a series of bits provided on input lines, comprising:

a binary full adder having a first set of inputs coupled to the input lines, a second set of inputs, a set of summation outputs and a carry output;

a first latch having a set of latch inputs each coupled to one of the summation outputs of the binary full adder, a clock input and a set of latched outputs each coupled to one of the second set of inputs of the binary full adder wherein the binary full adder sums the bits of the period command signal with bits appearing at the latched outputs and provides a summed value to the summation and carry outputs;

a finite state machine coupled to the carry output of the binary full adder and to the clock input of the latch wherein the finite state machine produces the oscillator signal at a period determined by the period command signal; and an additional latch having a set of latch inputs and a set of latched outputs wherein a DCO command signal is provided to the latch inputs over a series of lines, the sign signal is provided to the finite state machine from one of the latched outputs of the additional latch and the period command signal is provided to the first set of inputs of the binary full adder from the remaining latched outputs of the additional latch.

10. The DCO of claim 9, wherein the additional latch includes a clock input and wherein the clock inputs of the latches receive the oscillator signal from the finite state machine.

11. The DCO of claim 9, wherein the latches comprise D flip-flops.

* * * * *